(12) United States Patent
Baumann et al.

(10) Patent No.: US 11,230,664 B2
(45) Date of Patent: Jan. 25, 2022

(54) DIMMABLE LIGHT SOURCE

(71) Applicant: OSRAM OLED GmbH, Regensburg (DE)

(72) Inventors: Dominik Baumann, Munich (DE); Stefan Lange, Augsburg (DE)

(73) Assignee: OSRAM OLED GmbH, Regensburg (DE)

(*) Notice: Subject to any disclaimer, the term of this patent is extended or adjusted under 35 U.S.C. 154(b) by 0 days.

(21) Appl. No.: 16/637,282

(22) PCT Filed: Feb. 12, 2018

(86) PCT No.: PCT/EP2018/053416
§ 371 (c)(1),
(2) Date: Feb. 7, 2020

(87) PCT Pub. No.: WO2019/029849
PCT Pub. Date: Feb. 14, 2019

(65) Prior Publication Data
US 2020/0245428 A1 Jul. 30, 2020

(30) Foreign Application Priority Data

Aug. 10, 2017 (WO) ................. PCT/EP2017/070329
Aug. 10, 2017 (WO) ................. PCT/EP2017/070343
Nov. 10, 2017 (WO) ................. PCT/EP2017/078913

(51) Int. Cl.
*H05B 45/24* (2020.01)
*C09K 11/08* (2006.01)
(Continued)

(52) U.S. Cl.
CPC ........ *C09K 11/0883* (2013.01); *C09K 11/592* (2013.01); *C09K 11/7734* (2013.01);
(Continued)

(58) Field of Classification Search
None
See application file for complete search history.

(56) References Cited

U.S. PATENT DOCUMENTS 9,028,716 B2 5/2015 Winkler et al.
9,157,025 B2 10/2015 Winkler et al.
(Continued)

FOREIGN PATENT DOCUMENTS

CN 101124295 A 2/2008
CN 104781369 A 7/2015
(Continued)

OTHER PUBLICATIONS

German Search Report issued for the corresponding DE application No. 10 2016 121 692.5, dated Jun. 19, 2017 (for informational purpose only).
(Continued)

*Primary Examiner* — Dedei K Hammond
(74) *Attorney, Agent, or Firm* — Viering Jentschura & Partner MBB (57) ABSTRACT

A dimmable light source for emitting white overall radiation may include a dimmer and a light-emitting diode. The dimmer may vary a current intensity of a current for operating the light-emitting diode during the operation of the light source. The LED may include a semiconductor layer sequence to emit primary radiation, and the LED may further include a conversion element configured to at least partially convert the primary radiation into secondary radiation having a first emission band with a first emission maximum ranging from 400 nm to 500 nm and a second emission band with a second emission maximum ranging from 510 nm to 700 nm. A relative intensity of the first emission band may reduce with decreasing current intensity of the current for operating the LED, and a relative intensity
(Continued)

of the second emission band may increase with decreasing current intensity of the current for operating the LED.

11 Claims, 6 Drawing Sheets

(51) Int. Cl.
    *C09K 11/77* (2006.01)
    *H01L 33/50* (2010.01)
    *C09K 11/59* (2006.01)

(52) U.S. Cl.
    CPC ........ *C09K 11/7774* (2013.01); *H01L 33/502* (2013.01); *H01L 33/504* (2013.01); *H05B 45/24* (2020.01)

(56) References Cited

U.S. PATENT DOCUMENTS

| | | | |
|---|---|---|---|
| 10,479,936 B2 | 11/2019 | Seibald et al. | |
| 10,505,080 B2 | 12/2019 | Seibald et al. | |
| 10,644,206 B2 | 5/2020 | Seibald et al. | |
| 10,711,192 B2 | 7/2020 | Seibald et al. | |
| 2002/0190240 A1 | 12/2002 | Feldmann et al. | |
| 2006/0244358 A1 | 11/2006 | Kim et al. | |
| 2007/0166218 A1 | 7/2007 | Hirosaki et al. | |
| 2008/0224596 A1 | 9/2008 | Park et al. | |
| 2010/0155753 A1 | 6/2010 | Imanari et al. | |
| 2012/0019126 A1 | 1/2012 | Porob et al. | |
| 2013/0002167 A1* | 1/2013 | Van de Ven | F21V 13/08 315/297 |
| 2013/0020533 A1 | 1/2013 | Fujinaga et al. | |
| 2013/0093362 A1* | 4/2013 | Edwards | F21K 9/232 315/313 |
| 2013/0127333 A1 | 5/2013 | Jia et al. | |
| 2013/0140981 A1 | 6/2013 | Huber et al. | |
| 2014/0049155 A1 | 2/2014 | Kurtin | |
| 2014/0140055 A1 | 5/2014 | Chen et al. | |
| 2014/0159584 A1 | 6/2014 | Grajcar | |
| 2015/0109602 A1 | 4/2015 | Martin et al. | |
| 2015/0123155 A1 | 5/2015 | Schmidt et al. | |
| 2016/0043279 A1 | 2/2016 | Jean et al. | |
| 2016/0312118 A1 | 10/2016 | Fiedler et al. | |
| 2017/0040501 A1 | 2/2017 | Choi et al. | |
| 2017/0186911 A1 | 6/2017 | Otto et al. | |
| 2017/0186922 A1 | 6/2017 | Kim et al. | |
| 2017/0294561 A1 | 10/2017 | Ikeda et al. | |
| 2018/0127648 A1 | 5/2018 | Hirosaki | |
| 2018/0148644 A1 | 5/2018 | Seibald et al. | |
| 2018/0305613 A1 | 10/2018 | Bichler et al. | |
| 2019/0144744 A1 | 5/2019 | Seibald et al. | |
| 2019/0144745 A1 | 5/2019 | Seibald et al. | |
| 2019/0157520 A1 | 5/2019 | Seibald et al. | |
| 2019/0191516 A1* | 6/2019 | Li | F21K 9/232 |
| 2020/0245428 A1 | 7/2020 | Baumann et al. | |
| 2021/0184082 A1 | 6/2021 | Stoll et al. | |

FOREIGN PATENT DOCUMENTS

| | | | |
|---|---|---|---|
| DE | 202008018060 U1 | 5/2011 | |
| DE | 112011102173 T5 | 3/2013 | |
| DE | 102015107580 A1 | 11/2016 | |
| DE | 102017205819 A1 | 10/2017 | |
| EP | 2104149 A1 | 9/2009 | |
| EP | 2428543 B1 | 3/2012 | |
| EP | 2585554 B1 | 8/2016 | |
| JP | 2006237113 A | 9/2006 | |
| JP | 2009179662 A | 8/2009 | |
| JP | 2015526532 A | 9/2015 | |
| JP | 2018517806 A | 7/2018 | |
| WO | 2009096082 A1 | 8/2009 | |
| WO | 2012073177 A1 | 6/2012 | |
| WO | 2013175336 A1 | 11/2013 | |
| WO | 2016177890 A1 | 11/2016 | |

OTHER PUBLICATIONS

Nowitzki, B. et al.; "Neues über Oxide vom Typ A [(TO)n] [1]: NaLi3SiO4, NaLi3GeO4 und Nali3TiO4 [2]"; Revue de chimie minerale; dated 1986, p. 217-230 (including 1 page with English Abstract).

German Search Report issued for the corresponding DE application No. 10 2016 121 694.1, dated Jul. 7, 2017 (for informational purpose only).

German Search Report issued for the corresponding DE application No. 10 2018 108 842.6, dated Dec. 11, 2018 (for informational purpose only).

Pust, P. et al.; "Group (III) Nitrides M[Mg2Al2N4] (M=Ca,Sr,Ba,Eu) and Ba[Mg2Ga2N4]—Structural Relation and Nontypical Luminescence Properties of Eu2+ Doped Samples", Chem. Mater., 2014, 26, 6113.

Wilhelm, D. et al.; "Narrow-Band Red Emission in the Nitridolithoaluminate Sr4[LiAl11N14]:Eu2+", Chemistry of Materials, 2017, 29, p. 1204.

Wagatha P. et al.; "Ca18.75Li10.5[Al39N55]:Eu2+—Supertetrahedron Phosphor for Solid-State Lighting", Chemistry of Materials, 2016, 28, p. 1220.

Hofmann, J. et al.; Neue Silicate mit "Stuffed Pyrgoms": CsKNaLi9{Li[SiO4]}4, CsKNa2Li8{Li[SiO4]}4, RbNa3Li8{Li[SiO4]>4, und RbNaLi4{Li[SiO4]}4, Z. Anorg. Allg. Chem., 1994, 620, 1495-1508.

Weiss, C. et al.; Das erste Titanat mit „Stuffed Pyrgoms: RbNa3Li12[TiO4]4=RbNa3Li8{Li[TiO4]}4, Z. Anorg. Allg. Chem., 1994; 620, 2064-2069.

Pust, P. et al.,"Narrow-Band Red-Emitting Sr[LiAl3N4]:Eu2+ as a Next-Generation LED-Phosphor Material"; Nature materials, 2014, pp. 891-896.

Brandes, R. et al.; Das erste Oxogermanat mit „Stuffed Pyrgoms: CsNa3Lis8{Li[GeO4]}4, Z Anorg. Allg. Chem., 1995, 621, 713-718.

Bernet, K. et al.; Ein „Lithosilicat mit Kolumnareinheiten: RbLi5{Li[SiO4]}2, Z. Anorg. Allg. Chem.; 1991; 592; 93-105.

German Search Report issued for the corresponding DE application No. 10 2018 205 464.9, dated Feb. 8, 2019 (for informational purpose only).

Pejchal, J. et al.; "Improvement of the growth of Li4SiO4 single crystals for neutron detection and their scintillation and luminescence properties"; Journal of Crystal Growth; 2016; pp. 143-150, vol. 457; Elsevier B.V.

Werthmann, R. et al.; "Über Oxide des neuen Formeltyps A[T4O4]: Zur Kenntnis von KLi3GeO4, KLi3SiO4 und KLi3TiO4"; ZACC Journal of inorganic and general chemistry; Feb. 1984; 1 page Translation of Abstract + 16 pages, vol. 509, Issue 2; retrieved on https://onlinelibrary.wiley.com/doi/abs/10.1002/zaac.19845090202 on Mar. 5, 2020.

International Search Report based on Application No. PCT/EP2018/053416, 3 pages English Translation + 4 pages, dated May 2, 2018 (for reference purpose only).

International Search Report based on Application No. PCT/EP2017/070343, 3 pages English Translation + 4 pages, dated Nov. 10, 2017 (for reference purpose only).

International Search Report based on Application No. PCT/EP2017/078913, 3 pages English Translation + 4 pages, dated Feb. 22, 2018 (for reference purpose only).

Notification of Reason for Refusal issued for the Japanese patent application No. 2019507203, dated May 10, 2021, 3 pages (for informational purposes only).

U.S. Non-Final Office Action based on U.S. Appl. No. 16/926,821, dated Jun. 24, 2021, 6 pages (for informational purposes only).

Lucas et al., Measuring and using light in the melanopsin age, Trends in Neurosciences Jan. 2014 Vol 37 No. 1.

Pust, A. S. Wochnik, E. Baumann, P. J. Schmidt, D. Wiechert, C. Scheu, W. Schnick, Ca[LiAl3N4]:Eu2+ —A Narrow Band Red-Emitting Nitridolithoaluminate Chemistry of Materials 2014 26, 3544-3549.

(56) References Cited

OTHER PUBLICATIONS

Wang et al., "Narrow-band green emission of Eu2+ in a rigid tunnel structure: site occupations, barycenter energy calculations and luminescence properties", Inorganic Chemistry Frontiers, 6, 2019, pp. 3604-3612.
Office Action for U.S. Appl. No. 16/202,182, dated Oct. 5, 2021, 20 pages (for reference purposes only).

* cited by examiner

DIMMABLE LIGHT SOURCE

CROSS-REFERENCE TO RELATED APPLICATIONS

The present application is a national stage entry according to 35 U.S.C. § 371 of PCT application No.: PCT/EP2018/053416 filed on Feb. 12, 2018; which claims priority to PCT application NO.: PCT/EP2017/070343, which was filed on Aug. 10, 2017, PCT application No.: PCT/EP2017/070329, which was filed on Aug. 10, 2017, and PCT/EP2017/078913, which was filed on Nov. 10, 2017; all of which are incorporated herein by reference in their entirety and for all purposes.

TECHNICAL FIELD

The invention relates to a dimmable light source.

BACKGROUND

These days, light sources on the basis of light-emitting diodes (LEDs) are increasingly used in place of conventional incandescent lamps for general illumination, such as the illumination of living areas, for example. Light sources on the basis of light-emitting diodes have a substantially higher efficiency than conventional incandescent lamps. A property of incandescent lamps that consumers find desirable is that the correlated color temperature of the white overall radiation of an incandescent lamp can be reduced by changing the power supply and the change in the temperature of the filament connected therewith; this is also referred to as "dimming". Reducing the correlated color temperature leads to a displacement in the color point of the overall radiation on the Planck curve in the case of incandescent lamps, as a result of which the observer perceives the white overall radiation to be "warmer". Natural daylight also exhibits a similar profile throughout the course of a day. During early mornings and late evenings (sunrise and sunset), the daylight has a low intensity and, at the same time, a low color temperature, for example approximately 3000 K. By contrast, the intensity of the daylight is at a maximum around midday and, at the same time, the daylight has a much higher color temperature, typically of between 5000 K and 8000 K. The demand for dimmable light sources on the basis of light-emitting diode is therefore large as a result of the decline in incandescent lamps.

SUMMARY

A dimmable light source may include a light-emitting diode.

A dimmable light source for emitting white overall radiation is specified. The light source includes a light-emitting diode with a semiconductor layer sequence that is configured to emit primary electromagnetic radiation in the UV range of the electromagnetic spectrum during the operation of the light source. Further, the light-emitting diode includes a conversion element including a converter material that is configured to convert, in full or in part, the primary electromagnetic radiation into secondary electromagnetic radiation. In a non-limiting embodiment, the primary electromagnetic radiation is converted in full into secondary electromagnetic radiation.

Here, and below, "dimmable" is understood to mean that the brightness or light output power and the correlated color temperature (CCT) change during the operation of the light source with a change in the current intensity of the current for operating the light source or the light-emitting diode; in particular, the brightness or light output power and the correlated color temperature reduce with decreasing current intensity.

For the purposes of operating the dimmable light source, the latter is connected, in particular, to a power source that supplies a current with constant current intensity.

According to at least one embodiment, the light source includes a dimmer that is configured to vary a current intensity or a mean current intensity of a current for operating the light-emitting diode during the operation of the light source. Expressed differently, the current supply to the light-emitting diode can be modified by the dimmer. To this end, the dimmer is disposed upstream, in particular, of the light-emitting diode.

By way of example, the dimmer can be configured as an ohmic load, as a leading-edge phase dimmer (inductive load) or as a trailing-edge phase dimmer (capacitive load). In respect of design, function and structure in particular, dimmers are known to a person skilled in the art and will not be explained in any more detail here.

Here, in particular, a reduction in the current intensity leads to a reduced overall intensity or reduced light output power (measured in watt) of the primary electromagnetic radiation. Connected therewith, there is also a reduction in the overall intensity or light output power and in the luminous flux ("brightness", measured in lumen) of the secondary radiation and the overall radiation of the light source.

The converter material converting the primary electromagnetic radiation into secondary electromagnetic radiation in part means that the primary electromagnetic radiation is partly absorbed by the converter material and emitted as secondary radiation with a wavelength range, in particular a longer wavelength range, that differs at least in part from the primary radiation. In this so-called partial conversion, the dimmable light source emits an overall radiation, in particular, which is composed of the primary radiation and the secondary radiation. Thus, the dimmable light source may emit mixed radiation of primary radiation and secondary radiation. In particular, the component of primary radiation in the overall radiation lies below 10 percent, for example between 5 and 10 percent.

The converter material converting the primary electromagnetic radiation into secondary electromagnetic radiation in full means that the primary electromagnetic radiation is absorbed in full or virtually in full by the converter material and emitted in the form of secondary electromagnetic radiation. In particular, some of the absorbed primary electromagnetic radiation may also be emitted as heat. This may also be referred to as full conversion. Consequently, the emitted overall radiation of the light source corresponds completely or virtually completely to the secondary electromagnetic radiation. A virtually complete conversion should be understood to mean a conversion above 90%, more particularly above 95%. In a non-limiting embodiment, the primary electromagnetic radiation does not contribute, or only contributes slightly, to the overall radiation of the light source. The emitted overall radiation of the light source completely or virtually completely corresponding to the secondary electromagnetic radiation means, in particular, that the component of primary radiation in the overall radiation is very low and lies under 5 percent, such as under 3 percent, or alternatively at 0 percent.

According to at least one embodiment, the secondary radiation has a first emission band and a second emission band. The first emission band has an emission maximum, which lies in the range of 400 nm to 500 nm, and the second emission band has a second emission maximum, which lies in the range of 510 nm to 700 nm. Expressed differently, the emission spectrum of the converter material exhibits a first emission band with a first emission maximum in the range of 400 nm to 500 nm and a second emission band with a second emission maximum in the range between 510 nm and 700 nm. The emission spectrum may also include only the first and the second emission band and the first and the second emission maximum. In particular, the first emission band and the second emission band have an intensity, wherein the relative intensity of the first emission band reduces with decreasing current intensity and the relative intensity of the second emission band increases with decreasing current intensity. In particular, the component of secondary radiation from the first emission band in the overall radiation reduces with decreasing relative intensity of the first emission band and the component of secondary radiation from the second emission band in the overall radiation increases with increasing relative intensity of the second emission band.

An emission spectrum of the converter material has a maximum overall intensity of the secondary radiation for each current intensity, the value of said maximum overall intensity reducing with decreasing current intensity. Consequently, the maximum overall intensity of the secondary radiation reduces in the case of decreasing current intensity. While the overall intensity of the secondary radiation reduces overall, the intensity of one emission band may increase or reduce relative to the overall intensity, which is referred to here and below as relative intensity. The relative intensity of the first emission band reduces with decreasing current intensity and the relative intensity of the second emission band increases with decreasing current intensity, wherein, in particular, the overall intensity resulting from the first and second emission band reduces with decreasing current intensity.

Here, and below, an "emission band" is understood to mean an emission peak in an emission spectrum that has at least a full width at half maximum (FWHM) of the emission peak of 20 nm.

In the present case, an "emission maximum" denotes the wavelength in the emission spectrum where the maximum intensity of an emission band in the emission spectrum is located.

In a non-limiting embodiment, the first emission maximum is in the range of 450 nm to 490 nm and the second emission maximum is in the range of 550 to 650 nm.

Advantageously, the relative intensity of the first emission band with the first emission maximum in the range between 400 nm and 500 nm reduces with decreasing current intensity and the relative intensity of the second emission band with the second emission maximum in the range between 510 nm and 700 nm increases with decreasing current intensity. As a result, the component of the secondary radiation from the first emission band reduces in the white overall radiation and the component of the secondary radiation from the second emission band increases in the white overall radiation. This results in white overall radiation with decreasing correlated color temperature. The lower the correlated color temperature, the more warm white the white overall radiation appears to an observer. Advantageously, it is consequently possible to provide a dimmable light source by the opposing behavior of the relative intensities of the secondary radiation of the first emission band and of the second emission band in the case of decreasing current intensity of the current for operating the light-emitting diode.

According to at least one embodiment, the converter material has a temperature during the operation of the light source. The temperature of the converter material reduces with decreasing current intensity of the current with which the light-emitting diode is operated. In the case of the high current intensity or high current density, the converter material heats on account of energy losses from the energy difference of absorbed and emitted photons (Stokes shift) on the one hand and from further loss paths in the conversion process. Such loss paths are known to a person skilled in the art and include, for example, radiation-free relaxation from the excited state into the ground state (quantum efficiency of less than 1), scattering, more particularly backscattering, of excitation photons or secondary photons at the converter material and subsequent absorption by the semiconductor layer sequence or housing constituent parts. Advantageously, the temperature of the converter material consequently correlates with the current intensity or current density of the current with which the light-emitting diode is operated.

According to at least one embodiment, the semiconductor layer sequence includes an active layer that is configured to emit primary electromagnetic radiation in the UV range during the operation of the light source.

In this context, a "semiconductor layer sequence" should be understood to mean a semiconductor layer sequence including more than one layer, for example a sequence of a p-doped and an n-doped semiconductor layer, wherein the layers are disposed above one another and wherein at least one active layer that emits primary electromagnetic radiation is contained.

The semiconductor layer sequence can be embodied as an epitaxial layer sequence or as a radiation-emitting semiconductor chip with an epitaxial layer sequence, i.e., as a semiconductor layer sequence formed by epitaxial growth. Here, the semiconductor layer sequence can be formed on the basis of InGaAlN, for example. In particular, InGaAlN-based semiconductor chips and semiconductor layer sequences are those in which the semiconductor layer sequence produced in epitaxial fashion includes a layer sequence of different individual layers, which contains at least one individual layer having a material from the III-V compound semiconductor material system $In_xAl_yGa_{1-x-y}N$ with $0 \leq x \leq 1$, $0 \leq y \leq 1$ and $x+y \leq 1$. Semiconductor layer sequences that include at least one active layer on the basis of InGaAlN can emit primary electromagnetic radiation in an ultraviolet wavelength range. Here, and below, a wavelength range between 300 nm and 420 nm, including both limits, for example 400 nm, is understood to mean an ultraviolet wavelength range.

In addition to the active layer, the semiconductor layer sequence may include further functional layers and functional regions, for instance p- or n-doped charge carrier transport layers, i.e., electron or hole transport layers, undoped or p- or n-doped confinement-, cladding- or waveguide layers, barrier layers, planarization layers, buffer layers, protection layers and/or electrodes and combinations thereof. Furthermore, one or more mirror layers may be applied for example to a side of the semiconductor layer sequence facing away from the growth substrate. The structures relating to the active layer or the further functional layers and regions described here are known to a person skilled in the art, particularly in respect of design, function and structure, and are not explained in any more detail here for this reason.

According to at least one embodiment, the semiconductor layer sequence includes a radiation emergence area, above which the conversion element is disposed.

Here, and below, a layer or an element being disposed or applied "on" or "over" another layer or another element may mean, in this case, that the one layer or the one element is directly disposed with direct mechanical and/or electric contact on the other layer or the other element. Further, this may also mean that the one layer or the one element is disposed indirectly on or over the other layer or the other element. Here, further layers and/or elements may then be disposed between the one or between the other layer or the one or the other element.

Here, the radiation emergence area is a main area of the semiconductor layer sequence. In particular, the radiation emergence area extends parallel to a plane of principal extent of the semiconductor layers of the semiconductor layer sequence. By way of example, at least 75% or 90% of the primary radiation leaving the semiconductor layer sequence emerges from the semiconductor layer sequence via the radiation emergence area.

In one embodiment, the conversion element has direct mechanical contact with the semiconductor layer sequence, in particular with the radiation emergence area of the semiconductor layer sequence. A spaced-apart arrangement of the conversion element above the semiconductor layer sequence is also possible.

In one embodiment, the entire area of the conversion element is disposed over the semiconductor layer sequence, in particular the radiation emergence area of the semiconductor layer sequence.

In one embodiment, the conversion element includes a matrix material. The converter material can be distributed in the matrix material; for example, said converter material is homogeneously distributed in the matrix material.

The matrix material is transparent both to the primary radiation and to the secondary radiation and selected, for example, from a group of materials consisting of: glasses, silicones, epoxy resins, polysilazanes, polymethacrylates and polycarbonates and combinations thereof. Transparent is understood to mean that the matrix material is at least partly transmissive for the primary electromagnetic radiation and for the secondary radiation.

According to at least one embodiment, the converter material includes a phosphor with the formula $(Na_rK_{1-r})_1(TA)_3(TD)_1(XB)_4$:E with $0 \leq r \leq 0.05$, such as r=0, where
TA is selected from a group of monovalent metals including Li, Na, Cu, Ag and combinations thereof,
TD is selected from a group of tetravalent metals including Si, Ge, Sn, Mn, Ti, Zr, Hf, Ce and combinations thereof,
XB is selected from a group of elements including O, S and combinations thereof, and
E=Eu, Ce, Yb and/or Mn, such as E=Eu or Eu and Ce, Yb and/or Mn, or alternatively E=Eu.

Here, and below, phosphors are described on the basis of empirical formulae. In the specified empirical formulae, it is possible for the phosphor to have further elements, for example in the form of contaminations, wherein these contaminations together should have a proportion by weight in the phosphor of no more than at most 1 part per thousand or 100 ppm (parts per million) or 10 ppm.

According to at least one embodiment, the converter material may also consist of the phosphor $(Na_rK_{1-r})_1(TA)_3(TD)_1(XB)_4$:E.

Surprisingly, the secondary radiation of the phosphor $(Na_rK_{1-r})_1(TA)_3(TD)_1(XB)_4$:E has a first emission band with a first emission maximum in the range of 400 nm to 500 nm and a second emission band with a second emission maximum in the range of 510 nm to 700 nm. Advantageously, white overall radiation of the light source can consequently be generated using only this phosphor as a converter material.

According to at least one embodiment, the converter material includes a phosphor with the formula $(Na_rK_{1-r})Li_3SiO_4$:Eu with $0 \leq r \leq 0.05$, such as r=0, or consists of a phosphor with the formula $(Na_rK_{1-r})Li_3SiO_4$:Eu with $0 \leq r \leq 0.05$, such as r=0. The emission spectrum of the phosphor, and hence the secondary radiation, exhibits a first emission band with a first emission maximum in the range of 400 nm to 500 nm and a second emission band with a second emission maximum in the range between 510 nm and 700 nm, from which white overall radiation of the light source emerges. The inventors have discovered that, surprisingly, the relative intensity of the first emission band reduces in the case of decreasing temperature of the converter material and, by contrast, the relative intensity of the second emission band with the second emission maximum in the range between 510 nm and 700 nm increases in the case of decreasing temperature of the converter material. The temperature of the converter material correlates with the current intensity or the mean current intensity, with which the light-emitting diode is operated. When the current intensity is increased, there is an increase in the temperature of the converter material and the temperature of the converter material reduces when the current intensity is reduced. As a result, the correlated color temperature of the white overall radiation can be advantageously modified by varying the current intensity through the dimmer and a dimmable light source can be provided when $(Na_rK_{1-r})Li_3SiO_4$:Eu as only phosphor in the light source.

According to at least one embodiment, the converter material includes a first phosphor with the formula $(MA)Si_2O_2N_2$:Eu with MA=Sr, Ca and/or Ba and a second phosphor with the formula $CaLu_2Mg_2Si_3O_{12}$:Ce or said converter material consists of these phosphors. The emission spectrum of the first phosphor or the secondary radiation of the first phosphor $(MA)Si_2O_2N_2$:Eu exhibits a first emission band with a first emission maximum in the range of 400 nm to 500 nm and the emission spectrum of the second phosphor or the secondary radiation of the second phosphor $CaLu_2Mg_2Si_3O_{12}$:Ce exhibits a second emission band with a second emission maximum in the range between 510 nm and 700 nm, from which white overall radiation of the light source emerges.

According to at least one embodiment, the first phosphor has the formula $(Sr_xBA_{1-x})Si_2O_2N_2$:Eu with $0 \leq x \leq 1$, such as $0 \leq x \leq 0.5$, or alternatively x=0.25.

According to at least one embodiment, the converter material includes a first phosphor with the formula $(Rb_{r^*}Na_{1-r^*})_1(TA)_3(TD)_1(XB)_4$:E with $0<r^*<0.4$, such as $0.1 \leq r^* \leq 0.35$, or alternatively $0.2 \leq r^* \leq 0.3$, or $r^*=0.25$, and a second phosphor with the formula $CaLu_2Mg_2Si_3O_{12}$:Ce or said converter material consists of these phosphors, wherein
TA is selected from a group of monovalent metals including Li, Na, Cu, Ag and combinations thereof,
TD is selected from a group of tetravalent metals including Si, Ge, Sn, Mn, Ti, Zr, Hf, Ce and combinations thereof, XB is selected from a group of elements including O, S and combinations thereof, and E=Eu, Ce, Yb and/or Mn, such as E=Eu or Eu and Ce, Yb and/or Mn, or alternatively E=Eu.

According to at least one embodiment, the converter material includes a first phosphor with the formula $(Rb_r*Na_{1-r}*)Li_3SiO_4$ with $0<r*<0.4$, such as $0.1 \leq r* \leq 0.35$, or alternatively $0.2 \leq r* \leq 0.3$, or $r*=0.25$, and a second phosphor with the formula $CaLu_2Mg_2Si_3O_{12}:Ce$ or said converter material consists of these phosphors.

The inventors have discovered that, surprisingly, the phosphors $(MA)Si_2O_2N_2:Eu$ and $CaLu_2Mg_2Si_3O_{12}:Ce$ on the one hand and $(Rb_r*Na_{1-r}*)_1(TA)_3(TD)_1(XB)_4:E$, in particular $(Rb_r*Na_{1-r}*)Li_3SiO_4$, and $CaLu_2Mg_2Si_3O_{12}:Ce$ on the other hand have opposing behavior of the relative intensities of the first emission band and the second emission band when the temperature of the converter material is changed during the operation of the light-emitting diode. During the application, the temperature of the converter material correlates with the current intensity or the mean current intensity with which the light-emitting diode is operated; there is an increase in the temperature of the converter material when the current intensity is increased, and the temperature of the converter material drops when the current intensity is reduced. Surprisingly, the relative intensity of the first emission band of the first phosphor $(MA)Si_2O_2N_2:Eu$ or $(Rb_r*Na_{1-r}*)_1(TA)_3(TD)_1(XB)_4:E$ reduces with decreasing temperature of the converter material or with decreasing current intensity and the relative intensity of the second emission band of the second phosphor $CaLu_2Mg_2Si_3O_{12}:Ce$ increases with decreasing temperature of the converter material or with decreasing current intensity. As a result, the correlated color temperature of the white overall radiation can be modified by varying the current intensity through the dimmer and a dimmable light source can be provided by the combination of the first and of the second phosphor in the light source.

According to at least one embodiment, a color point of the overall radiation has a distance from the Planck curve of less than 20 SDMC, such as less than 15 SDMC, or alternatively less than 10 SDMC. Advantageously, these color points are obtainable in the entire dimming range of the light source and consequently obtainable from the maximum to the minimum current intensity or from the maximum temperature of the converter material to the minimum temperature of the converter material. By way of example, the minimum temperature can be 20° C. or 25° C. and the maximum temperature can be 225° C. Advantageously, the overall radiation consequently raises an impression of white light for an observer over the entire dimming range.

According to at least one embodiment, a color point of the overall radiation has a color rendering index Ra of more than 70, such as more than 75, or alternatively more than 80. In particular, a color point of the overall radiation has a color rendering index Ra of more than 70, such as more than 75, or alternatively more than 80 in the entire dimming range and consequently from the maximum to the minimum current intensity or from the maximum temperature of the converter material to the minimum temperature of the converter material.

According to at least one embodiment, the light source includes two or more light-emitting diodes. The two or more light-emitting diodes are the same light-emitting diodes. The light-emitting diodes being the same means that these have an identical structure within the scope of manufacturing tolerances and consequently are based on the same materials and, in particular, emit the same secondary radiation with the same color point. The second or further light-emitting diodes are consequently embodied like the (first) light-emitting diode.

Using only the same light-emitting diodes but nevertheless having the light source that is dimmable is advantageously possible in the case of the light source. This can be traced back to the opposing behavior of the relative intensities of the first and the second emission bands.

Conventionally used white light-emitting diodes exhibit no changes, or virtually no changes, in the color point of the overall radiation when there are changes in the current intensity/temperature of the converter material. Instead, active attempts are made to prevent possible variations of the color point when there are changes in the current intensity/temperature. Therefore, previously known light sources, which only contain one type of light-emitting diodes or only the same white light-emitting diodes, are not suitable for dimming and consequently not suitable for imitating the "dimming behavior" of a conventional incandescent lamp, in contrast to the light source.

According to at least one embodiment, the light-emitting diodes are actuatable together. Consequently, one dimmer within the light source is also advantageously sufficient. It is possible to dispense with complicated electronics that would be necessary in the case of a separate actuation of light-emitting diodes.

The dimmable light source can be embodied as a retrofit lamp.

BRIEF DESCRIPTION OF THE DRAWINGS

Further advantageous embodiments and developments of the dimmable light source emerge from the exemplary embodiments described below in conjunction with the figures.

In the embodiments and figures, components which are the same or of the same type, or which have the same effect, are respectively provided with the same references. The elements represented and their size ratios with respect to one another are not to be regarded as to scale. Rather, individual elements, in particular layer thicknesses, may be represented exaggeratedly large for better understanding.

DETAILED DESCRIPTION

Figure 1:
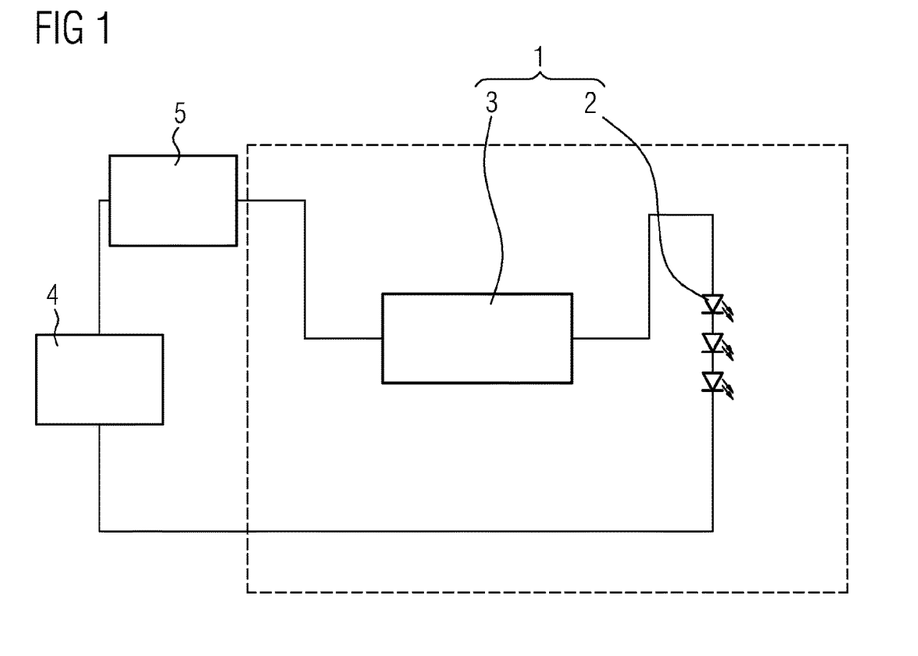
FIGS. 1 and 12 show a light source integrated in an electric circuit.

FIG. 1 shows a light source 1, which is integrated into an electric circuit. The light source 1 includes a plurality of light-emitting diodes 2 and a dimmer 3. The light source 1 is connected to a power source 4, which supplies the current required for operating the light source 1. A current with constant current intensity or current density emerges from the power source 4. The dimmer 3 is configured to vary the current intensity or current density of the current such that the light-emitting diodes 2 can be supplied with current with different current intensities. The change in the current intensity can be altered by a user by way of a manual control element 5 and the overall radiation of the light source 1 can consequently be "dimmed". The light-emitting diodes 2 have the same structure and consequently emit the same, or virtually the same, secondary radiation. Same light-emitting diodes should be understood to mean, in particular, that the semiconductor layers are based on the same semiconductor material and the conversion element contains the same converter material or the same converter material and the same matrix material, in particular also in the same quantities, within the scope of manufacturing tolerances. Therefore, the light-emitting diodes 2 can advantageously be operated with the same current; a separate actuation is not required. Further light-emitting diodes 2 of the same type can be connected in series or else in parallel (not shown).

The structure of the light-emitting diodes 2, which is not illustrated in FIG. 1 for reasons of clarity, is described below: the light-emitting diodes 2 include a semiconductor layer sequence on the basis of InGaAlN and emit primary electromagnetic radiation in the UV range of the electromagnetic spectrum, for example at 400 nm, during the operation of the light source 1. A conversion element including a converter material is disposed in the beam path of the primary electromagnetic radiation, wherein the converter material consists of a phosphor $KLi_3SiO_4$:Eu (AB1), a first phosphor $Sr_{0.25}Ba_{0.75}Si_2O_2N_2$:Eu and a second phosphor $(CaLu_2)Mg_2Si_3O_{12}$:Ce (AB2) or a first phosphor $Rb_{0.25}Na_{0.75}Li_3SiO_4$:Eu and a second phosphor $(CaLu_2)Mg_2Si_3O_{12}$:Ce (AB3). The primary electromagnetic radiation is absorbed by the converter material and converted, in full or virtually in full, into secondary radiation that is emitted to the outside by the light source 1 as white overall radiation.

If the current intensity of the current is reduced proceeding from a maximum current intensity by means of the dimmer 3, there is a change in the temperature of the converter material and, as a result thereof, there is a change in the color point of the overall radiation to lower correlated color temperatures. Advantageously, the color point of the overall radiation at different temperatures and hence at different current intensities lies on or near the Planck curve such that the overall radiation always appears white.

Advantageously, it is consequently possible to provide a dimmable light source 1, which contains only one type of light-emitting diode 2 or only the same light-emitting diodes 2. Moreover, only one phosphor or a combination of two phosphors as a converter material is required for the light-emitting diodes 2. The secondary radiation of the converter material has a first emission band with a first emission maximum in the range of 400 nm to 500 nm and a second emission band with a second emission maximum in the range of 510 nm to 700 nm. Expressed differently, the emission spectrum of the converter material exhibits a first emission band with a first emission maximum in the range of 400 nm to 500 nm and a second emission band with a second emission maximum in the range of 510 nm to 700 nm. The relative intensity of the first emission band reduces with decreasing current intensity and the relative intensity of the second emission band increases with decreasing current intensity of the current with which the light-emitting diodes are operated. In particular, a decreasing relative light output power is connected to a decreasing relative intensity and an increasing relative light output power is connected to an increasing relative intensity, and so the component of the secondary radiation of the first emission band in the overall radiation reduces with decreasing current intensity while the component of the secondary radiation of the second emission band in the overall radiation increases. The different relative intensities of the first emission band and the second emission band can be traced back to the surprisingly different thermal quenching behavior of the emission bands. Since the temperature of the converter material increases with increasing current intensity, the different thermal quenching behavior can be exploited to provide a dimmable light source and consequently to imitate a conventional incandescent lamp.

Figure 12:
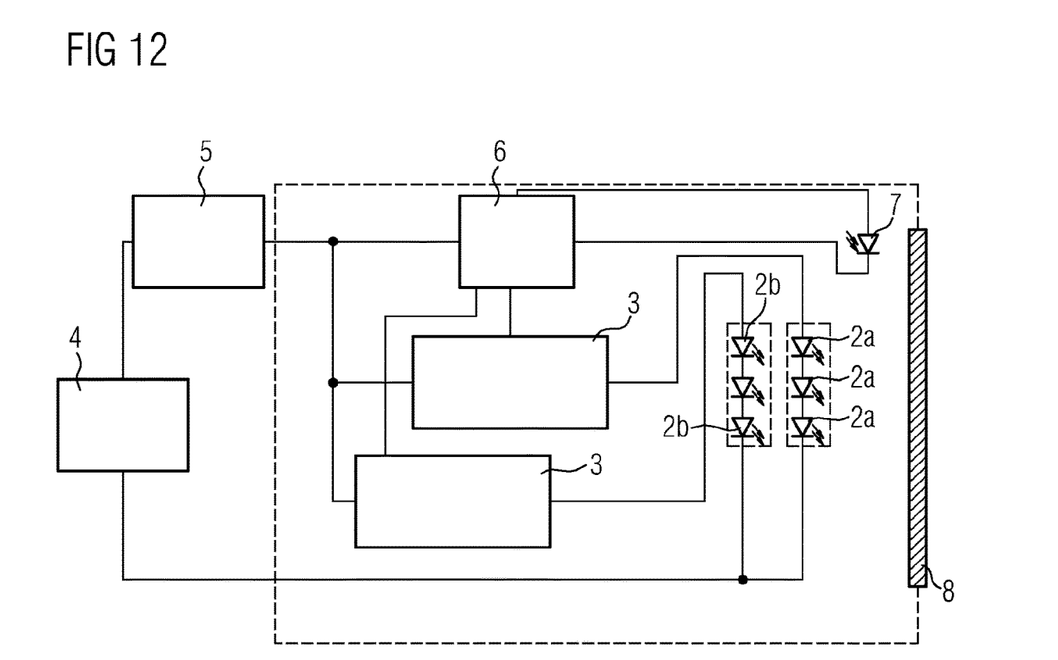

FIG. 12 shows a light source 1 from the prior art, which is integrated into an electric circuit. The light source 1 contains two types of light-emitting diodes 2a and 2b, which are connected in parallel and which are actuated separately. Accordingly, the light source 1 contains two dimmers 3. A microcontroller 6 is required for controlling the dimmers 3; said microcontroller not being required in the light source 1 as the latter contains only one dimmer 3. The light source 1 contains a sensor 7 for controlling the functionality of the microcontroller 6. The light-emitting diodes 2a emit white secondary radiation and the light-emitting diodes 2b emit red secondary radiation. The red and white secondary radiation are mixed by means of a diffusor 8 and yield the white overall radiation, which is emitted to the outside by the light source 1. In order to change the color point, the current intensity is modified separately by means of the dimmers 3 for the light-emitting diodes 2a and 2b, and so these are operated with current with different current intensities, and consequently the relative component of the secondary radiations of the light-emitting diodes 2a and 2b in the overall radiation is altered. Here, a higher component of red secondary radiation in the overall radiation results in a more warm white overall radiation, i.e., a lower correlated color temperature.

Advantageously, in contrast to the known dimmable light source 1, only one type of light-emitting diodes 2 is required for changing the color point of the overall radiation and consequently for designing the light source 1 to be "dimmable" in the dimmable light source 1. Additionally, only one dimmer 3 is required in the light source and it is possible to dispense with further electronic components, such as a microcontroller 6 and a sensor 7, and also dispense with a diffusor 8 for mixing the secondary radiations.

Consequently, the light source 1 is both more cost-effective and producible with less outlay than the dimmable light source 1 from the prior art. As a result of using the same light-emitting diodes 2 in the light source 1, the color point of the overall radiation in the case of a constant current intensity advantageously does not change over the service life of the light source 1. However, this occurs in the known light sources 1 with different light-emitting diode types 2a and 2b on account of the different aging stability of the different light-emitting diodes 2a and 2b.

Figure 2:
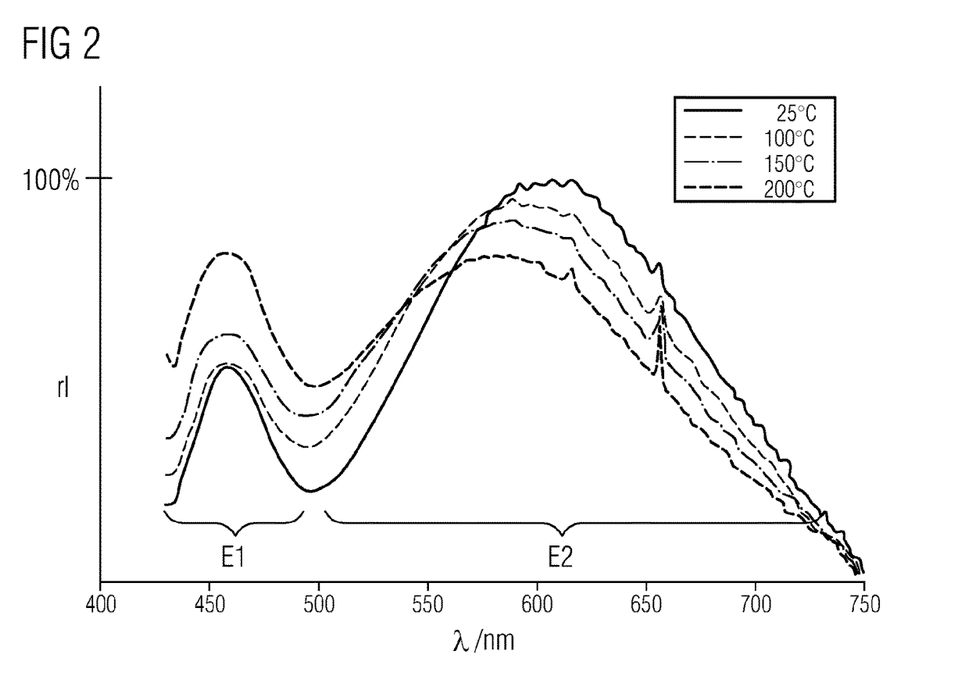
FIGS. 2, 4 and 6 show emission spectra at different temperatures.

FIG. 2 shows the emission spectrum of the phosphor $KLi_3SiO_4$:Eu (AB1) at 25° C., 100° C., 150° C. and 200° C. Here, the wavelength λ in nanometers is plotted along the x-axis and the relative intensity rI in percent is plotted along the y-axis. For the purposes of measuring the emission spectra, the phosphor $KLi_3SiO_4$:Eu was applied to a heat-conducting substrate, brought to the corresponding temperature and excited by primary electromagnetic radiation in the UV range (400 nm). The emission spectrum of $KLi_3SiO_4$:Eu at the respective temperature exhibits a respective first emission band E1 with a first emission maximum, which is located in the range from approximately 440 nm to 470 nm, and a second emission band E2 with a second emission maximum, which is located in the range from approximately 570 to 630 nm. The first emission band E1 extends in each case from approximately 430 nm to 500 nm and the second emission band E2 extends in each case from approximately 500 nm to 730 nm. For reasons of clarity, the first emission band E1 and the second emission band E2 are only labeled for the emission spectrum at 25° C. in the figure. The emitted secondary radiation of the measured emission spectra at the different temperatures gives an observer an impression of shining in white. As is evident, the relative intensity of the first emission band E1 reduces in the case of decreasing temperature while the relative intensity of the second emission band E2 increases in the case of decreasing temperature. With a decreasing relative intensity of an emission band, the light output power from this emission band decreases and, with an increasing relative intensity of an emission band, the light output power from this emission band increases. Consequently, the component of secondary radiation in the wavelength range between 430 nm and 500 nm reduces with decreasing temperature and the component of secondary radiation in the wavelength range between 500 nm and 730 nm increases.

Expressed differently, the long-wavelength, predominantly red component of the secondary radiation increases while the short-wavelength, predominantly blue component decreases, leading to a change in the color point of the secondary radiation. Since the temperature of the phosphor likewise decreases with a decreasing current intensity of a current with which a light-emitting diode with a conversion element containing the phosphor $KLi_3SiO_4$:Eu is operated, a light source containing such a light-emitting diode may surprisingly change the color point by varying the current intensity by means of a dimmer and hence said light source can be dimmed, wherein the overall radiation appears white both in the dimmed state and in the non-dimmed state.

Figure 3:
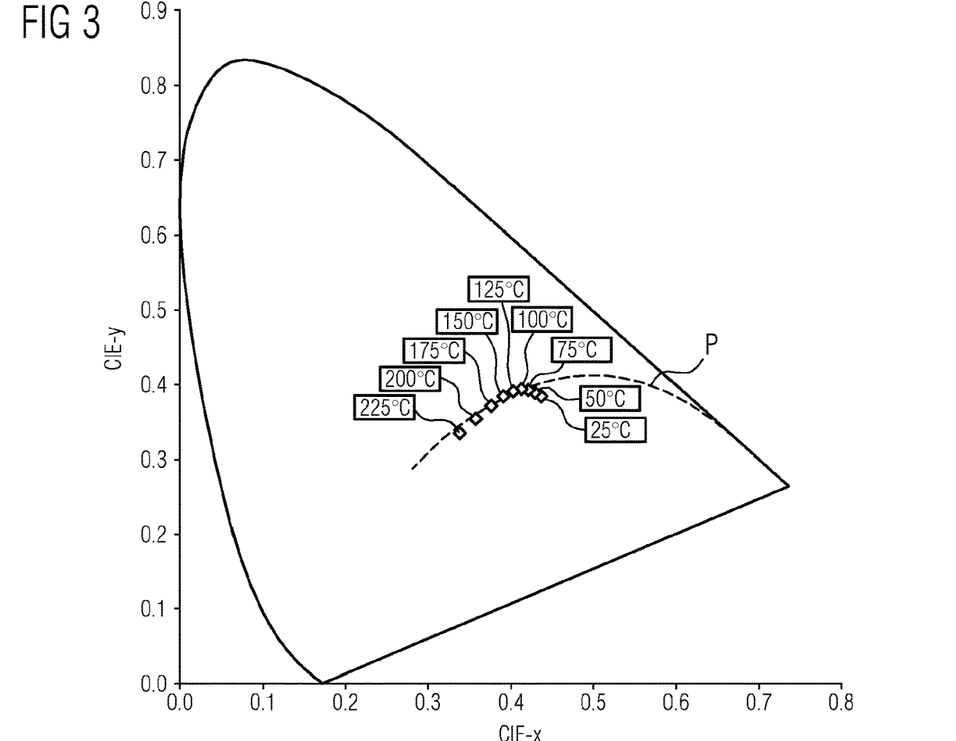
FIGS. 3, 5 and 7 show color points at different temperatures in the CIE standard diagram (1931)

FIG. 3 shows the CIE standard diagram (1931), wherein the CIE x-component of the primary color red is plotted along the x-axis and the CIE y-component of the primary color green is plotted along the y-axis. In the CIE standard diagram, the color points of the secondary radiation of $KLi_3SiO_4$:Eu (AB1) are shown in the case of an excitation with primary electromagnetic radiation in the UV range (400 nm) at different temperatures. In the case of a decreasing temperature, the color points move on or along the Planck curve P to higher CIE x-values, and hence to a higher red component of the secondary radiation and lower correlated color temperatures. At 225° C., the correlated color temperature of the secondary radiation is at approximately 5400 K (cold white) and, at 25° C., it is at approximately 2860 K (warm white). As is evident, the color points of the secondary radiation are located at or near the Planck curve and the second radiation consequently appears white. A light source including a light-emitting diode with a conversion element containing the phosphor $KLi_3SiO_4$:Eu can consequently change the color point to lower correlated color temperatures by reducing the current intensity by means of a dimmer.

Figure 4:
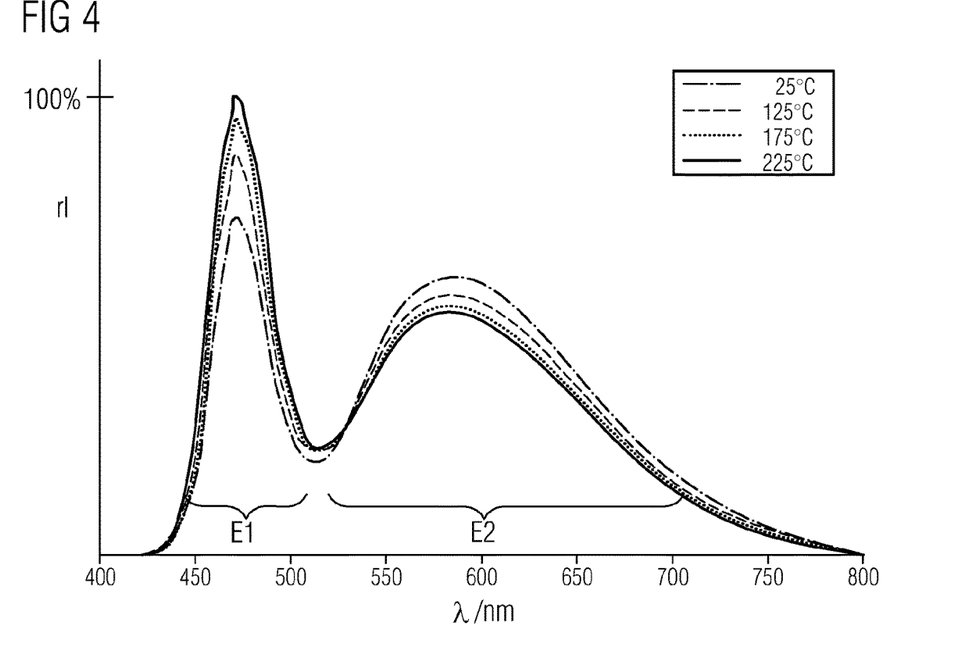

FIG. 4 shows the emission spectrum of a combination of the phosphors $Sr_{0.25}Ba_{0.75}Si_2O_2N_2$:Eu and $(CaLu_2)Mg_2Si_3O_{12}$:Ce (AB2) at 25° C., 125° C., 175° C. and 225° C. Here, the wavelength λ in nanometers is plotted along the x-axis and the relative intensity rI in percent is plotted along the y-axis. For the purposes of measuring the emission spectra, the phosphors $Sr_{0.25}Ba_{0.75}Si_2O_2N_2$:Eu and $(CaLu_2)Mg_2Si_3O_{12}$:Ce were mixed in a ratio to obtain a color point of the secondary radiation of the phosphors at or near the Planck curve such that an impression of shining in white is raised. The phosphors are applied to a heat-conducting substrate, brought to the corresponding temperature and excited by primary electromagnetic radiation in the UV range. The emission spectrum of the combination of the phosphors $Sr_{0.25}Ba_{0.75}Si_2O_2N_2$:Eu and $(CaLu_2)Mg_2Si_3O_{12}$:Ce at the respective temperature exhibits a respective first emission band E1 with a first emission maximum in the range from approximately 460 nm to 490 nm and a second emission band E2 with a second emission maximum in the range from approximately 560 nm to 630 nm. For reasons of clarity, the first emission band E1 and the second emission band E2 are only labeled for the emission spectrum at 25° C. in the figure. The emitted secondary radiation of the measured emission spectra at the different temperatures gives an observer an impression of shining in white. As is evident, the relative intensity of the first emission band E1 reduces in the case of decreasing temperature while the relative intensity of the second emission band E2 increases in the case of decreasing temperature. Consequently, with a decreasing temperature, the component of secondary radiation in the wavelength range of the first emission band E1 decreases and the component of the secondary radiation of the second emission band E2 increases. Expressed differently, the long-wavelength, predominantly red component of the secondary radiation increases while the short-wavelength, predominantly blue component decreases, leading to a change in the color point of the secondary radiation. Since the temperature of the phosphors likewise decreases with a decreasing current intensity of a current with which a light-emitting diode with a conversion element containing the phosphors $Sr_{0.25}Ba_{0.75}Si_2O_2N_2$:Eu and $(CaLu_2)Mg_2Si_3O_{12}$:Ce is operated, a light source containing such a light-emitting diode may surprisingly change the color point by varying the current intensity by means of a dimmer and hence said light source can be dimmed, wherein the overall radiation appears white both in the dimmed state and in the non-dimmed state.

Figure 5:
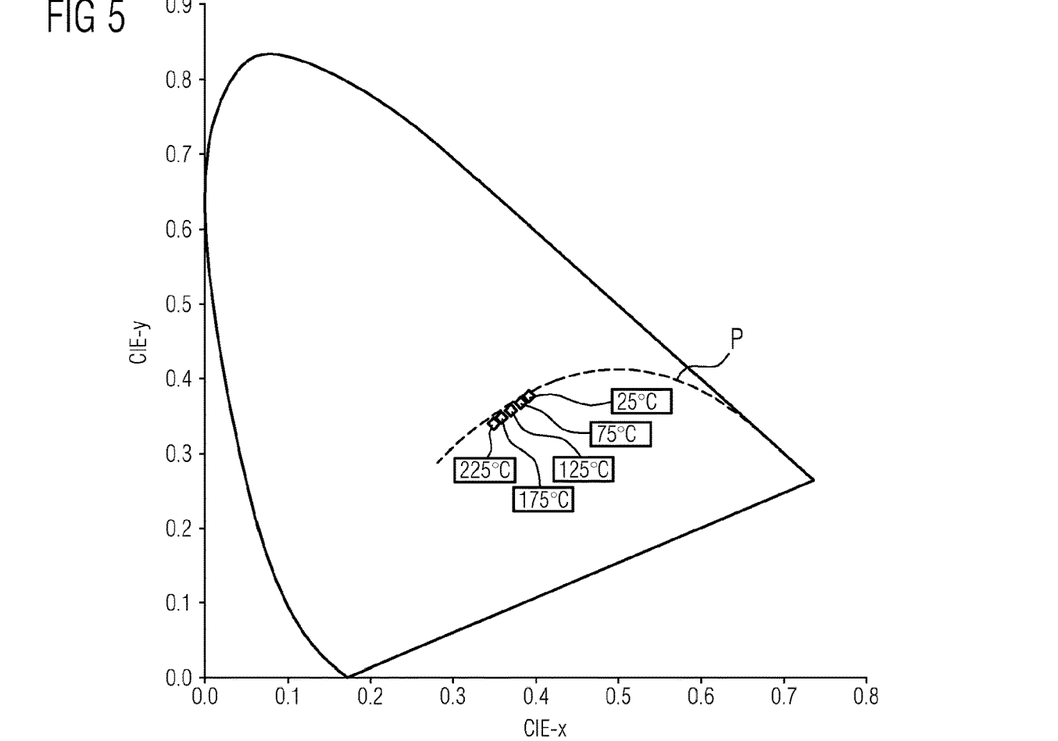

FIG. 5 shows the CIE standard diagram (1931), wherein the CIE x-component of the primary color red is plotted along the x-axis and the CIE y-component of the primary color green is plotted along the y-axis. In the CIE standard diagram, the color points of the secondary radiation of a combination of the phosphors $Sr_{0.25}Ba_{0.75}Si_2O_2N_2$:Eu and $(CaLu_2)Mg_2Si_3O_{12}$:Ce (AB2) are shown in the case of an excitation with primary electromagnetic radiation in the UV range at different temperatures. In the case of a decreasing temperature, the color points move on or along the Planck curve P to higher CIE x-values, and hence to a higher red component of the secondary radiation and lower correlated color temperatures. At 225° C., the correlated color temperature of the secondary radiation is at approximately 4800 K and, at 25° C., it is at approximately 3750 K. As is evident, the color points of the secondary radiation are located at or near the Planck curve and consequently appears white. A light source including a light-emitting diode with a conversion element containing the phosphors $Sr_{0.25}Ba_{0.75}Si_2O_2N_2$:Eu and $(CaLu_2)Mg_2Si_3O_{12}$:Ce can consequently change the color point to lower correlated color temperatures by reducing the current intensity by means of a dimmer.

Figure 6:
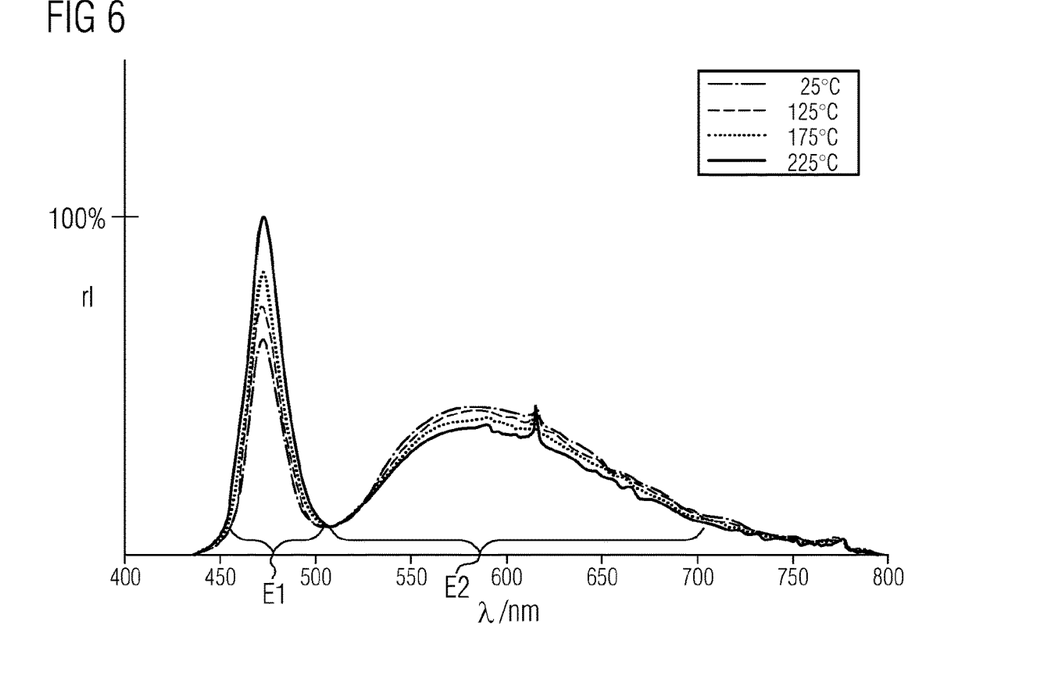

FIG. 6 shows the emission spectrum of a combination of the phosphors $Rb_{0.25}Na_{0.75}Li_3SiO_4$:Eu and $(CaLu_2)Mg_2Si_3O_{12}$:Ce (AB3) at 25° C., 125° C., 175° C. and 225° C. Here, the wavelength λ in nanometers is plotted along the x-axis and the relative intensity rI in percent is plotted along the y-axis. For the purposes of measuring the emission spectra, the phosphors $Rb_{0.25}Na_{0.75}Li_3SiO_4$:Eu and $(CaLu_2)Mg_2Si_3O_{12}$:Ce were mixed in a ratio to obtain a color point of the secondary radiation of the phosphors at or near the Planck curve such that an impression of shining in white is raised. The phosphors are applied to a heat-conducting substrate, brought to the corresponding temperature and excited by primary electromagnetic radiation in the UV range. The emission spectrum of the combination of $Rb_{0.25}Na_{0.75}Li_3SiO_4$:Eu and $(CaLu_2)Mg_2Si_3O_{12}$:Ce at the respective temperature exhibits a respective first emission band E1 with a first emission maximum in the range from approximately 460 nm to 490 nm and a second emission band E2 with a second emission maximum in the range from approximately 560 nm to 630 nm. The emitted secondary radiation of the measured emission spectra at the different temperatures gives an observer an impression of shining in white. As is evident, the relative intensity of the first emission band E1 reduces in the case of decreasing temperature while the relative intensity of the second emission band E2 increases in the case of decreasing temperature. Consequently, with a decreasing temperature, the component of secondary radiation of the first emission band decreases and the component of secondary radiation of the second emission band increases. Expressed differently, the long-wavelength, predominantly red component of the secondary radiation increases while the short-wavelength, predominantly blue component decreases, leading to a change in the color point of the secondary radiation. Since the temperature of the phosphors likewise decreases with a decreasing current intensity of a current with which a light-emitting diode with a conversion element containing the phosphors $Rb_{0.25}Na_{0.75}Li_3SiO_4$:Eu and $(CaLu_2)Mg_2Si_3O_{12}$:Ce is operated, a light source containing such a light-emitting diode may surprisingly change the color point by varying the current intensity by means of a dimmer and hence said light source can be dimmed, wherein the overall radiation appears white both in the dimmed state and in the non-dimmed state.

Figure 7:
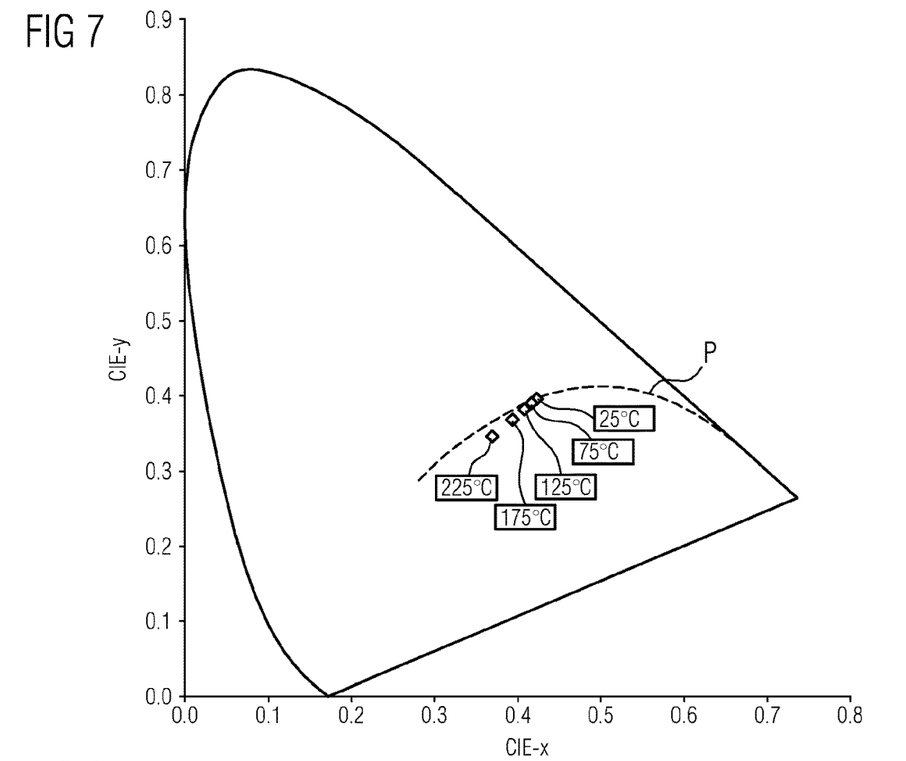

FIG. 7 shows the CIE standard diagram (1931), wherein the CIE x-component of the primary color red is plotted along the x-axis and the CIE y-component of the primary color green is plotted along the y-axis. In the CIE standard diagram, the color points of the secondary radiation of a combination of the phosphors $Rb_{0.25}Na_{0.75}Li_3SiO_4$:Eu and $(CaLu_2)Mg_2Si_3O_{12}$:Ce (AB3) are shown in the case of an excitation with primary electromagnetic radiation in the UV range at different temperatures. In the case of a decreasing temperature, the color points move on or along the Planck curve P to higher CIE x-values, and hence to a higher red component of the secondary radiation and lower correlated color temperatures. At 225° C., the correlated color temperature of the secondary radiation is at approximately 4200 K and, at 25° C., it is at approximately 3300 K. As is evident, the color points of the secondary radiation are located at or near the Planck curve and consequently the secondary radiation appears white. The distance of the color point from the Planck curve can be observed to increase with increasing temperature. A light source including a light-emitting diode with a conversion element containing the phosphors $Rb_{0.25}Na_{0.75}Li_3SiO_4$:Eu and $(CaLu_2)Mg_2Si_3O_{12}$:Ce can consequently change the color point to lower correlated color temperatures by reducing the current intensity by means of a dimmer.

Figure 8:
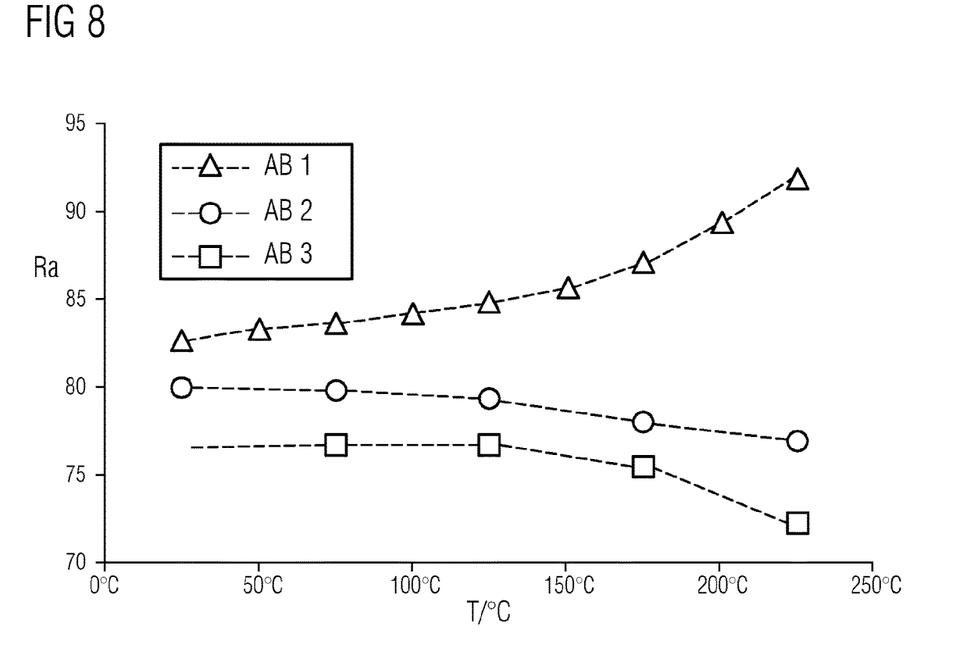
FIG. 8 shows the dependence of the color rendering index Ra on the temperature.

FIG. 8 shows the dependence of the color rendering index Ra of the secondary radiation of the phosphor $KLi_3SiO_4$:Eu (AB1), a combination of the phosphors $Sr_{0.25}Ba_{0.75}Si_2O_2N_2$:Eu and $(CaLu_2)Mg_2Si_3O_{12}$:Ce (AB2) and a combination of the phosphors $Rb_{0.25}Na_{0.75}Li_3SiO_4$:Eu and $(CaLu_2)Mg_2Si_3O_{12}$:Ce (AB3) on the temperature during an excitation with primary electromagnetic radiation in the UV range. The color rendering index Ra is a measure for the quality of the rendering of colors of radiation and its maximum can be 100.

AB1 exhibits an Ra of more than 80 over the entire temperature range. A radiation with an Ra of 80 or more is desirable for general illumination. Advantageously, Ra increases with increasing temperature. The light output power of the light source increases with increasing temperature since this has a higher emission of the primary electromagnetic radiation, which is provided for the conversion into the second radiation, as a consequence. High color rendering with a simultaneously high light output power is desirable, particularly in the case of cold white overall radiation of a light source, i.e., at high correlated color temperatures. By way of example, this overall radiation is suitable when good color rendering is required, for example one observing or creating pieces of art, while the requirements on the color rendering index of the overall radiation of the light source are lower in the dimmed state.

In AB2 and AB3, Ra drops with increasing temperature. Light sources including a light-emitting diode with a conversion element containing combination of the phosphors $Rb_{0.25}Na_{0.75}Li_3SiO_4$:Eu and $(CaLu_2)Mg_2Si_3O_{12}$:Ce or $Sr_{0.25}Ba_{0.75}Si_2O_2N_2$:Eu and $(CaLu_2)Mg_2Si_3O_{12}$:Ce are therefore predominantly suitable for applications in which warm white overall radiation is desired and the light source is consequently operated predominantly in the dimmed state and consequently at a comparatively low current intensity.

Figure 9:
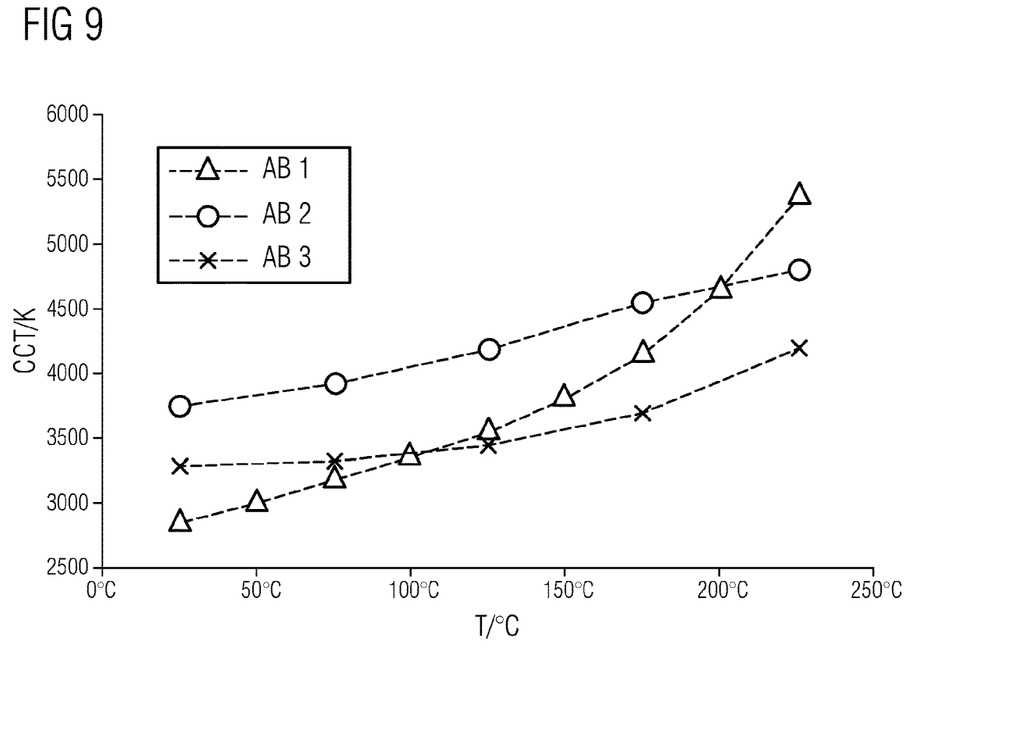
FIG. 9 shows the dependence of the correlated color temperature on the temperature.

FIG. 9 shows the dependence of the correlated color temperature CCT in K of the secondary radiation of the phosphor $KLi_3SiO_4$:Eu (AB1), a combination of the phosphors $Sr_{0.25}Ba_{0.75}Si_2O_2N_2$:Eu and $(CaLu_2)Mg_2Si_3O_{12}$:Ce (AB2) and a combination of the phosphors $Rb_{0.25}Na_{0.75}Li_3SiO_4$Eu and $(CaLu_2)Mg_2Si_3O_{12}$:Ce (AB3) on the temperature in the case of an excitation with primary electromagnetic radiation in the UV range. The correlated color temperature is a measure as to whether white radiation is perceived as warm white or cold white. Usually, warm white radiation has a correlated color temperature below 3500 K and cold white radiation has a correlated color temperature above 3500 K. The correlated color temperature increases with increasing temperature in AB1, AB2 and AB3. Transferred to a light source, the correlated color temperature increases with increasing current intensity of the current with which the light source is operated. $KLi_3SiO_4$:Eu (AB1), a combination of the phosphors $Sr_{0.25}Ba_{0.75}Si_2O_2N_2$:Eu and $(CaLu_2)Mg_2Si_3O_{12}$:Ce (AB2) and a combination of the phosphors $Rb_{0.25}Na_{0.75}Li_3SiO_4$:Eu and $(CaLu_2)Mg_2Si_3O_{12}$:Ce (AB3) are consequently suitable for a dimmable light source including a light-emitting diode with a conversion element containing $KLi_3SiO_4$:Eu (AB1), a combination of the phosphors $Sr_{0.25}Ba_{0.75}Si_2O_2N_2$:Eu and $(CaLu_2)Mg_2Si_3O_{12}$:Ce (AB2) or a combination of the phosphors $Rb_{0.25}Na_{0.75}Li_3SiO_4$:Eu and $(CaLu_2)Mg_2Si_3O_{12}$:Ce (AB3). Advantageously, such light sources can change the color point to lower correlated color temperatures by reducing the current intensity by means of a dimmer.

Figure 10:
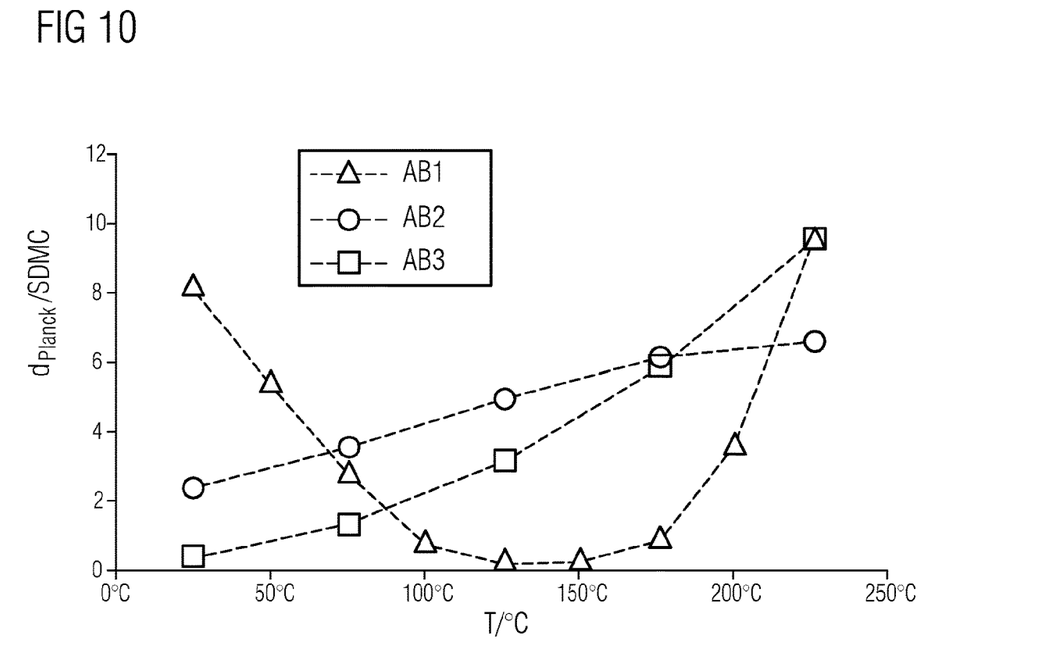
FIG. 10 shows the distance of color points from the Planck curve at different temperatures.

FIG. 10 shows the distance of the color points of the secondary radiation of the phosphor $KLi_3SiO_4$:Eu (AB1), a combination of the phosphors $Sr_{0.25}Ba_{0.75}Si_2O_2N_2$:Eu and $(CaLu_2)Mg_2Si_3O_{12}$:Ce (AB2) and a combination of the phosphors $Rb_{0.25}Na_{0.75}Li_3SiO_4$:Eu and $(CaLu_2)Mg_2Si_3O_{12}$:Ce (AB3) from the Planck curve in the case of excitation with primary electromagnetic radiation in the UV range, in SDCM units ("standard deviation of color matching" or "MacAdam ellipse steps" or threshold units) at different temperatures. All color points lie on or near the Planck curve and generate an impression of shining in white. The color points of the secondary radiation of AB1 exhibit a very small distance from the Planck curve, particularly in the range between 75 and 175° C., with a minimum distance at approximately 125° C.

Figure 11:
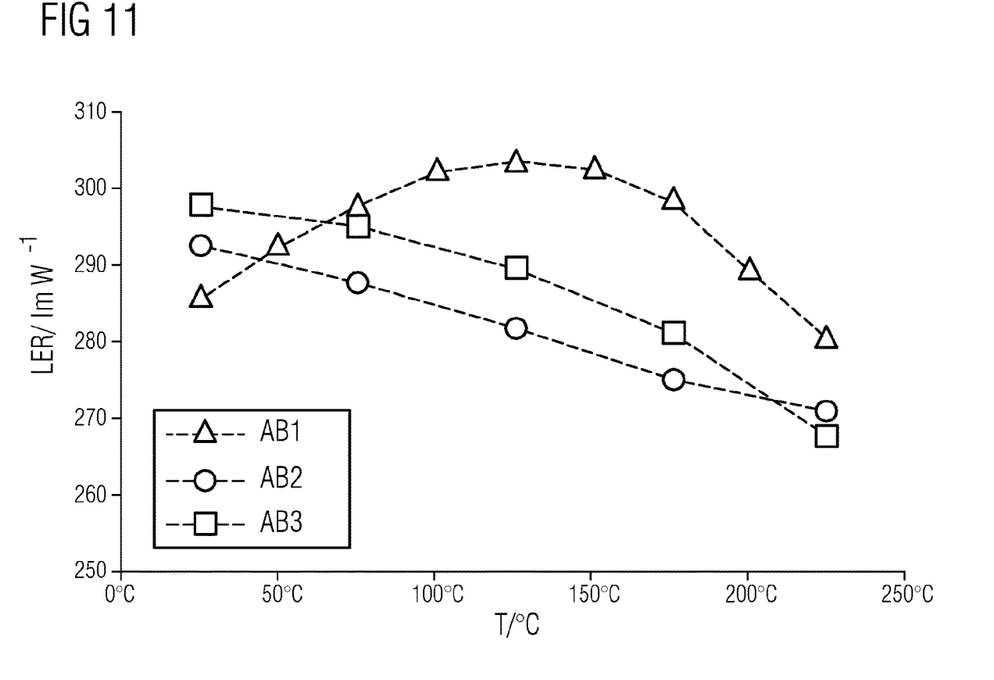
FIG. 11 shows the dependence of the light yield on the temperature.

FIG. 11 specifies the light yield LER in lm/W of the secondary radiation of the phosphor $KLi_3SiO_4$:Eu (AB1), a combination of the phosphors $Sr_{0.25}Ba_{0.75}Si_2O_2N_2$:Eu and $(CaLu_2)Mg_2Si_3O_{12}$:Ce (AB2) and a combination of the phosphors $Rb_{0.25}Na_{0.75}Li_3SiO_4$:Eu and $(CaLu_2)Mg_2Si_3O_{12}$:Ce (AB3) in the case of excitation with primary electromagnetic radiation in the UV range, as a function of the temperature. It is evident that a light yield of more than 280 lm/W is reached for AB1 over the entire temperature range, with, at 304 lm/W, the highest light yield being obtained at approximately 125° C. At 125° C., the smallest distance of the color point from the Planck curve, and hence the "purest" white, is also obtained for the secondary radiation of AB1 (see FIG. 10). The secondary radiation of AB2 and AB3 exhibit a drop in the light yield with increasing temperature. Therefore, an application of a light source with AB2 and AB3 tends to find use in the dimmed state, and hence during operation with a current with a reduced current intensity.

The description on the basis of the exemplary embodiments does not restrict the invention thereto. Rather, the invention includes every novel feature and every combination of features, containing every combination of features in the patent claims, in particular, even if this feature or this combination itself is not explicitly specified in the patent claims or exemplary embodiments.

LIST OF REFERENCE SIGNS

λ Wavelength
AB Exemplary embodiment
P Planck curve
rI Relative intensity
lm Lumen
W Watt
LER Light yield
LED Light-emitting diode
CCT Correlated color temperature
Ra Color rendering index
K Kelvin
nm Nanometer
T Temperature
° C. Degrees Celsius
E1 First emission band
E2 Second emission band
1 Dimmable light source
2 Light-emitting diode
3 Dimmer
4 Power source
5 Manual control element
6 Microcontroller
7 Sensor
8 Diffusor

The invention claimed is:

1. A dimmable light source for emitting white overall radiation, wherein the light source comprises:
   a dimmer; and
   two or more of the same light-emitting diodes, wherein:
   the dimmer is configured to vary a current intensity of a current for operating the two or more of the same light-emitting diodes during the operation of the light source; and
   each light-emitting diode of the two or more of the same light-emitting diodes comprises:
      a semiconductor layer sequence configured to emit primary electromagnetic radiation in the UV range of the electromagnetic spectrum during the operation of the light source; and
      a conversion element, comprising a converter material configured to at least partially convert, the primary electromagnetic radiation into secondary electromagnetic radiation, having a first emission band with a first emission maximum ranging from 400 nm to 500 nm and a second emission band with a second emission maximum of ranging from 510 nm to 700 nm; and wherein a relative intensity of the first emission band reduces with decreasing current intensity of the current for operating the two or more of the same light-emitting diodes, and a relative intensity of the second emission band increases with decreasing current intensity of the current for operating the two or more of the same light-emitting diodes; wherein the converter material comprises a first phosphor with the formula $(MA)Si_2O_2N_2$:Eu with MA=Sr, Ca and/or Ba, and a second phosphor with the formula $CaLu_2Mg_2Si_3O_{12}$:Ce.

2. The dimmable light source as claimed in claim 1, wherein the converter material is configured to convert the primary electromagnetic radiation into the secondary electromagnetic radiation in full; and wherein the white overall radiation completely, corresponds to the secondary radiation.

3. The dimmable light source as claimed in claim 1, wherein a temperature of the converter material reduces with decreasing current intensity of the current for operating the two or more of the same light-emitting diodes.

4. The dimmable light source as claimed in claim 1, wherein the overall radiation has a correlated color temperature, which reduces with decreasing current intensity of the current for operating the two or more of the same light-emitting diodes.

5. The dimmable light source as claimed in claim 1, wherein the primary electromagnetic radiation has a wavelength ranging from 300 nm to 420 nm.

6. The dimmable light source as claimed in claim 1, wherein the converter material consists of the first phosphor with the formula $(MA)Si_2O_2N_2$:Eu and the second phosphor with the formula $CaLu_2Mg_2Si_3O_{12}$:Ce.

7. The dimmable light source as claimed in claim 6, wherein the first phosphor has the formula $(Sr_xBa_{1-x})Si_2O_2N_2$:Eu with $0 \leq x \leq 0.5$.

8. The dimmable light source as claimed in claim 6, wherein the first phosphor has the formula $(Sr_xBa_{1-x})Si_2O_2N_2$:Eu with $x=0.25$.

9. The dimmable light source as claimed in claim 1, wherein the first phosphor has the formula $(Sr_xBa_{1-x})Si_2O_2N_2$:Eu with $0 \leq x \leq 1$.

10. The dimmable light source as claimed in claim 1, wherein the dimmer is a single dimmer.

11. The dimmable light source as claimed in claim 1, wherein the dimmer is configured to actuate the two or more of the same light-emitting diodes together.

* * * * *